(12) United States Patent
Deshpande et al.

(10) Patent No.: US 7,729,121 B1
(45) Date of Patent: Jun. 1, 2010

(54) REMOVABLE PACKAGE UNDERSIDE DEVICE ATTACH

(75) Inventors: Anand Deshpande, Bangalore (IN);
Venkat Natarajan, Bangalore (IN);
Ashok Kabadi, Portland, OR (US);
Vittal Kini, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/317,855

(22) Filed: Dec. 30, 2008

(51) Int. Cl.
*H05K 7/20* (2006.01)

(52) U.S. Cl. .............. 361/704; 361/700; 361/707; 361/719; 361/735; 361/790; 257/719; 257/727; 165/80.3

(58) Field of Classification Search .............. None
See application file for complete search history.

(56) References Cited

U.S. PATENT DOCUMENTS

| | | | | |
|---|---|---|---|---|
| 5,309,324 A | * | 5/1994 | Herandez et al. | 361/734 |
| 5,831,825 A | * | 11/1998 | Fromont | 361/719 |
| 6,392,887 B1 | * | 5/2002 | Day et al. | 361/704 |
| 6,750,551 B1 | * | 6/2004 | Frutschy et al. | 257/785 |
| 6,862,186 B2 | * | 3/2005 | Belady et al. | 361/721 |
| 7,280,365 B2 | * | 10/2007 | Belson et al. | 361/721 |
| 7,428,154 B2 | * | 9/2008 | Ishimine et al. | 361/704 |

* cited by examiner

*Primary Examiner*—Boris L Chervinsky
(74) *Attorney, Agent, or Firm*—Paul E. Steiner

(57) ABSTRACT

In some embodiments, a stacked package assembly may include a first socket defining an interior cavity, a first semiconductor device coupled to the first socket, a second socket positioned within the interior cavity of the first socket, and a second semiconductor device removably coupled to the second socket within the cavity of the first socket. The second socket may be positioned between the first semiconductor device and the second semiconductor device and provide an electrical connection between the first semiconductor device and the second semiconductor device. Other embodiments are disclosed and claimed.

25 Claims, 5 Drawing Sheets

REMOVABLE PACKAGE UNDERSIDE DEVICE ATTACH

TECHNICAL FIELD

The invention relates to integrated circuit device packaging. More particularly, some embodiments of the invention relate to a removable package underside interconnect.

BACKGROUND AND RELATED ART

Some electronic systems may utilize three dimensional (3D) packaging or other stacked package arrangements.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
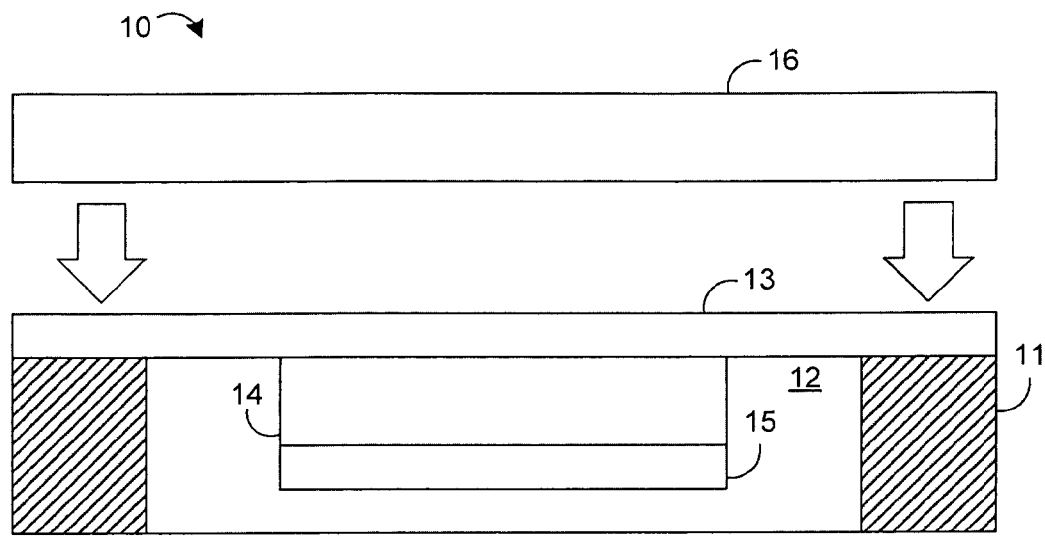
FIG. 1 is a block diagram of an electronic system in accordance with some embodiments of the invention.

With reference to FIG. 1, in accordance with some embodiments of the invention a stacked package assembly 10 may include a first socket 11 defining an interior cavity 12, a first semiconductor device 13 coupled to the first socket 11, a second socket 14 positioned within the interior cavity 12 of the first socket 11, and a second semiconductor device 15 removably coupled to the second socket 14 within the cavity 12 of the first socket 11. For example, the second socket 14 may be positioned between the first semiconductor device 13 and the second semiconductor device 15 and may provide an electrical connection between the first semiconductor device 13 and the second semiconductor device 15. For example, the second semiconductor device 15 may be solderlessly coupled to the second socket 14.

In some embodiments of the invention, the assembly 10 may include a single loading mechanism 16 to provide a compression connection between all of the first socket 11, the first semiconductor device 13, the second socket 14, and the second semiconductor device 15. For example, the second socket 14 may be soldered to the first semiconductor device 13 and the second socket 14 may include a single compression interconnect mechanism. Alternatively, in some embodiments of the invention, the second socket 14 may include a removable socket. For example, the removable second socket 14 may include a double compression interconnect mechanism.

For example, in some embodiments of the invention the removable second socket 14 may include a coarse alignment feature on a side of the second socket 14 proximate the second semiconductor device 15 and a fine alignment feature on another side of the second socket 14 proximate the first semiconductor device 13. As non-limiting examples, the removable second socket 14 may include one of a land grid array socket, a ball grid array socket, and a pin grid array socket.

Figure 2:
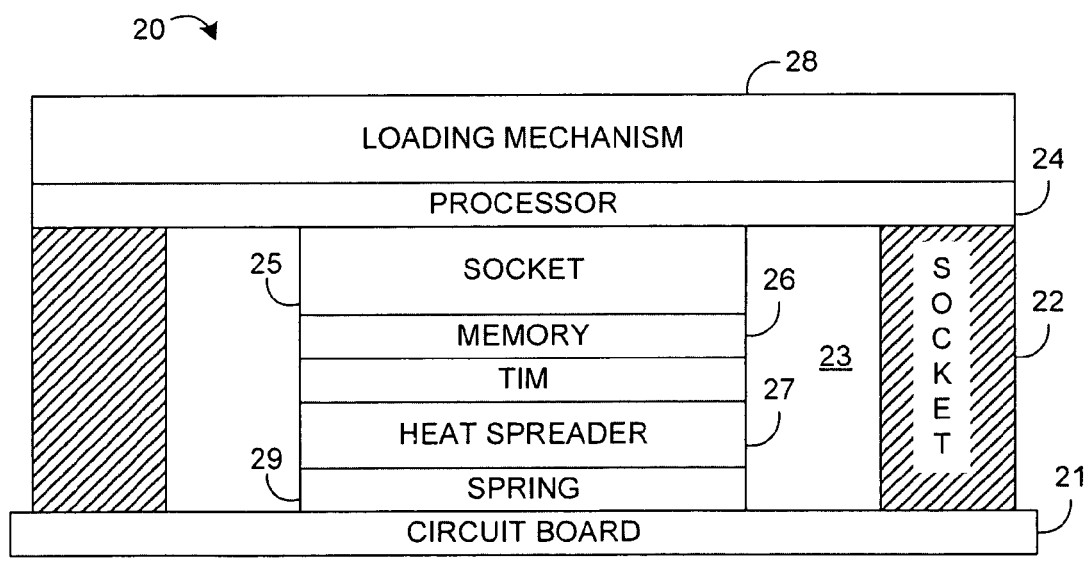
FIG. 2 is a block diagram of another electronic system in accordance with some embodiments of the invention.

With reference to FIG. 2, a processor-based system 20 may include a circuit board 21, a first socket 22 mounted on the circuit board 21, the first socket 22 defining an interior cavity 23, a processor device 24 coupled to the first socket 22, a second socket 25 positioned within the cavity 23 of the first socket 22, a memory device 26 removably coupled to the second socket 25 within the cavity 23 of the first socket 22, wherein the second socket 25 is positioned between the processor device 24 and the memory device 26 and provides an electrical connection between the processor device 24 and the memory device 26, and a heat spreader 27 thermally coupled to the memory device 26 within the cavity 23 of the first socket 22, wherein the heat spreader 27 is positioned between the circuit board 21 and the memory device 26. For example, the memory device 26 may be solderlessly coupled to the second socket 25.

In some embodiments of the invention, the system 20 may further include a single loading mechanism 28 to provide a compression connection between all of the first socket 22, the processor device 24, the second socket 25, and the memory device 26. For example, the system 20 may further include a spring mechanism 29 positioned between the circuit board 21 and the heat spreader 27. For example, the second socket 25 may be soldered to the processor device 24 and the second socket 25 may include a single compression interconnect mechanism. Alternatively, the second socket 25 may include a removable socket. For example, the removable second socket 25 may include a double compression interconnect mechanism.

In some embodiments of the invention, the removable second socket 25 may include a coarse alignment feature on a side of the second socket 25 proximate the memory device 26 and a fine alignment feature on another side of the second socket 25 proximate the processor device 24. As non-limiting examples, the removable second socket 25 may include one of a land grid array socket, a ball grid array socket, and a pin grid array socket.

In some embodiments of the invention, the system 20 may further include thermal interface material (TIM) positioned between the memory device 26 and the heat spreader 27. The system 20 may further include a heat pipe (not shown) thermally coupled to the heat spreader 27. For example, the processor device 24 may include a central processor unit (CPU) or a graphics processor.

Some embodiments of the invention may provide a removable interconnect for CPU-package underside device attach. Advantageously, some embodiments of the invention may provide a mechanism for package-underside device placement in such a way that the underside devices can be removed and replaced, if necessary, without any soldering or reflow process. For example, some embodiments of the invention may be particularly useful for stacked processor/memory complexes in multi- and/or many-core CPUs and in particular 3D-stacked packages.

Advantageously, some embodiments of the invention may solve inventory management problems. For example, if the memory die is soldered to the package, the die must be attached to the package at a relatively early stage during the package manufacturing. This may require a large inventory of the memory dies to be maintained along with inventory of a range of processor package SKUs each with a different memory configuration. In the proposed methods, the memory die can be attached in a later or the last stage of the package attachment. Advantageously, the memory can even be attached by OEM suppliers of the products instead of the processor manufacturer.

In some packaging arrangements, one or more devices may be located on the underside of the main package substrate and under normal operation may be situated inside the socket cavity. For example, the underside devices could be the DRAM in a stacked processor/memory complex. A problem with mounting DRAM on the underside of the processor package substrate is that should the DRAM device fail, the whole package may need to be replaced. Furthermore, should the DRAM need to be upgraded or changed for any reason, it is difficult to do so without requiring a significant assembly and reflow process. Advantageously, some embodiments of the invention may overcome this problem by providing a mechanism by which the DRAM device is attached to the package underside in a removable fashion. Advantageously, some embodiments of the invention may allow easy removal and replacement of the DRAM, thereby enabling easy DRAM replacements or up-grades as and when required.

Some embodiments of the invention may utilize a removable connector such as, for example, a Land Grid Array (LGA) connector. An LGA-like connector may require a loading mechanism to apply a significant amount of compression force and keep the contacts in compression at all times during product operation. Advantageously, some embodiments of the invention may make use of the CPU-socket compression mechanism to apply the required compression force for the underside DRAM LGA as well, thus not requiring any additional loading mechanism.

Figure 3:
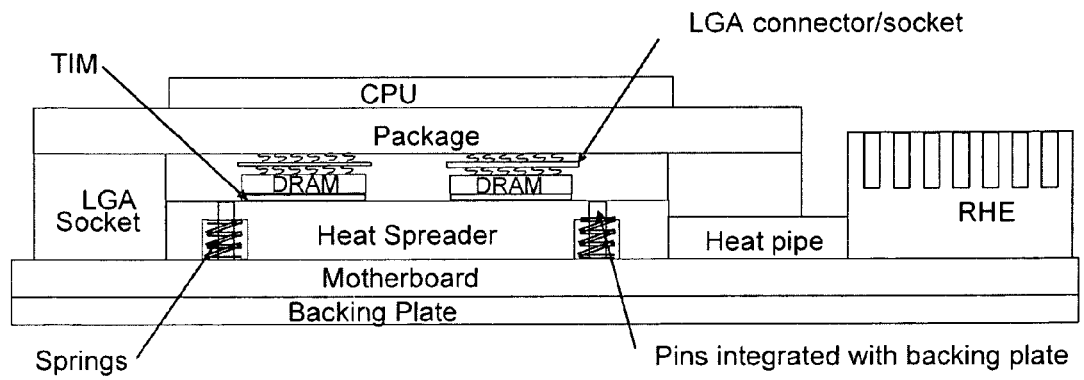
FIG. 3 is a block diagram of another electronic system in accordance with some embodiments of the invention.

With reference to FIG. 3, in accordance with some embodiments of the invention, a processor-based system may include two or more DRAM devices in a CPU socket cavity. A 3D packaging arrangement in accordance with some embodiments of the invention may include a motherboard with an LGA socket defining an interior cavity mounted on one side of the motherboard. A CPU package may be mounted on the LGA socket. A backing plate may provide additional structural support on the other side of the mother board. Pins integrated with the backing plate may extend through holes in the motherboard into the LGA socket cavity. Springs may be positioned around the pins and the heat spreader may be positioned over the pins.

Another LGA connector/socket may be positioned on an underside of the CPU package between the DRAM devices and the CPU package. The DRAM devices may be removably coupled to the LGA connectors/sockets. For example, the DRAM devices may be coupled to the LGA connectors by a compressive force. For example, a loading mechanism may compress the 3D package stack together to provide both the mechanical and electrical coupling of the CPU device and the DRAM devices. One side of the DRAM devices may be thermally coupled to the heat spreader. For example, a thermal interface material (TIM) may be provided between the DRAM devices and the heat spreader. Advantageously, some embodiments of the invention may provide a relatively easy, removable assembly of DRAM devices on an underside of a CPU package.

For example, although not critical to the present invention some embodiments of the invention may utilize a segmented socket such as the segmented socket described in United States Patent Publication No. 2009-0096086, published Apr. 16, 2009, (patent application Ser. No. 11/974,595, filed Oct. 15, 2007), entitled Cooling System For Semiconductor Devices, which is incorporated by reference herein. For example, some embodiments of the invention may utilize a thermal solution based on this segmented socket. For example, the segmented socket may have cuts or streets which allow a heat pipe to be routed from the socket cavity to a Remote Heat Exchanger (RHE) located on the motherboard. This provides an example cooling solution for the devices mounted within the socket cavity.

Figure 4:
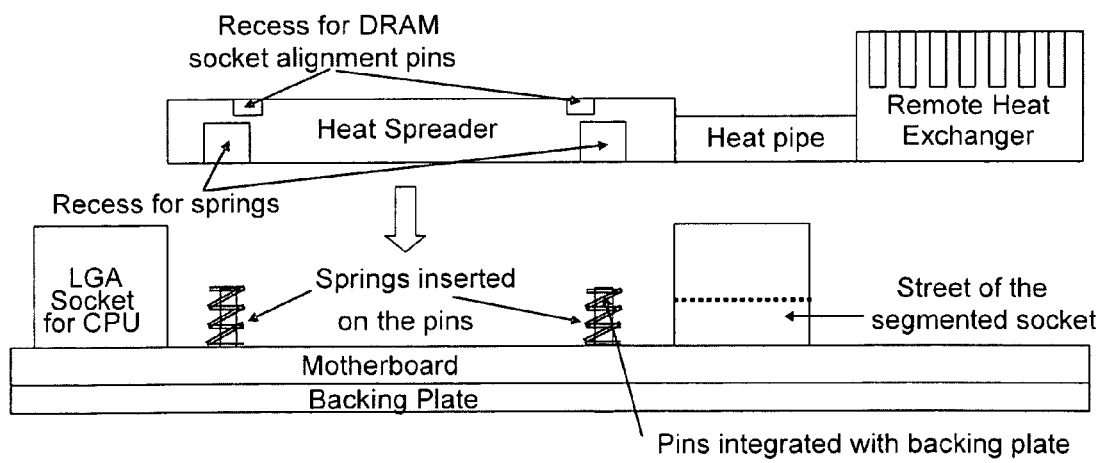
FIG. 4 is another block diagram in accordance with some embodiments of the invention.
Figure 5:
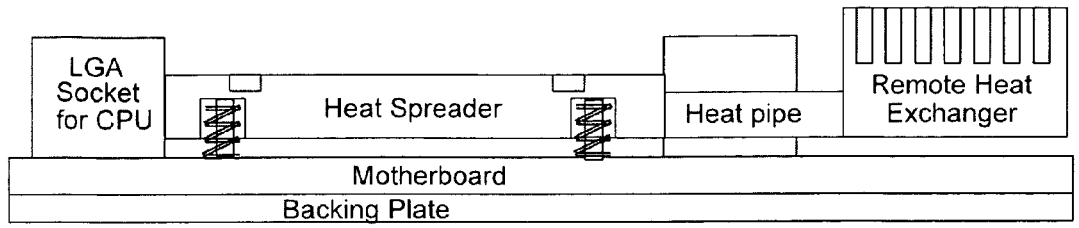
FIG. 5 is another block diagram in accordance with some embodiments of the invention.

With reference to FIGS. 4-9, an example assembly process is illustrated in block diagrams. In FIG. 4, a backing plate with integrated pins may be attached to the motherboard (e.g. attachment using nuts and bolts not shown here). The springs may be inserted on the pins and the heat spreader assembly can be installed on the pins. For example, in some embodiments of the invention there may be four locator pins bolted to the motherboard, which protrude in the socket cavity. A set of small helical springs may be mounted on these pins. Then the heat spreader (copper attach) with embedded heat pipe may be mounted on the posts. For example, the heat spreader may have corresponding holes positioned for the locator pins to pass through. For example, the heat spreader may have a recess for the springs to fit in. FIG. 5 shows the heat spreader with embedded heat pipe inserted on the pins. The heat pipe passes through the segmented socket streets.

The springs in the bottom of the heat spreader need not be helical springs. For example, elastomer pads may provide the spring action. Advantageously, elastomer pads with sufficient spring action may simplify the assembly process. Other spring mechanisms may also be suitable for other embodiments of the invention.

Figure 6:
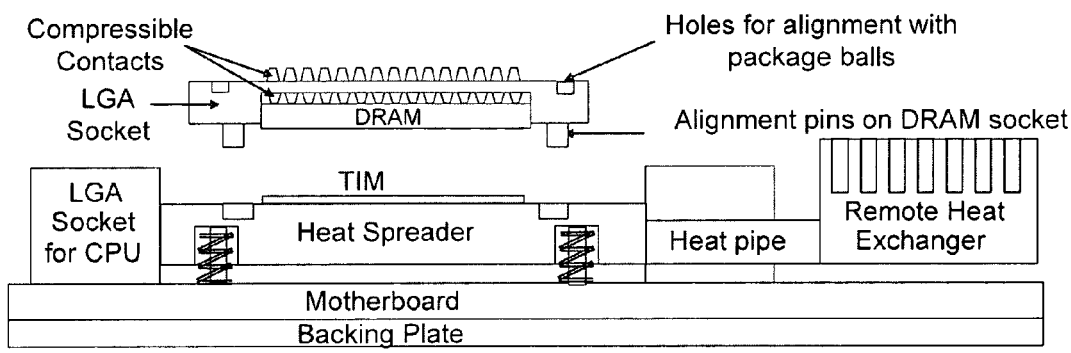
FIG. 6 is another block diagram in accordance with some embodiments of the invention.
Figure 7:
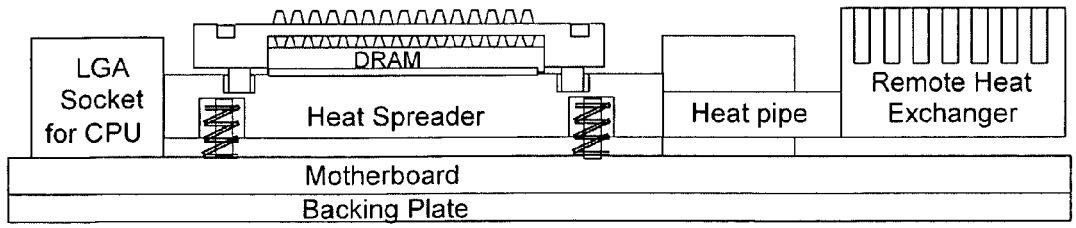
FIG. 7 is another block diagram in accordance with some embodiments of the invention.

In FIG. 6, the DRAM may be inserted in a double compression type LGA device socket. For example, the socket has a frame that accepts a DRAM device. The DRAM socket may have pins and holes for alignment as shown. For example, the DRAM device to be connected can have either solder balls or lands, and the LGA connector for the DRAM may be selected accordingly. The CPU package underside may have LGA lands. A removable LGA socket may be used to connect the DRAM device to the CPU package underside. Thermal Interface Material (TIM) may be applied on the heat spreader. FIG. 7 shows the DRAM socket inserted on top of the heat spreader using the alignment pins. The alignment pins help ensure coarse alignment.

Figure 8:
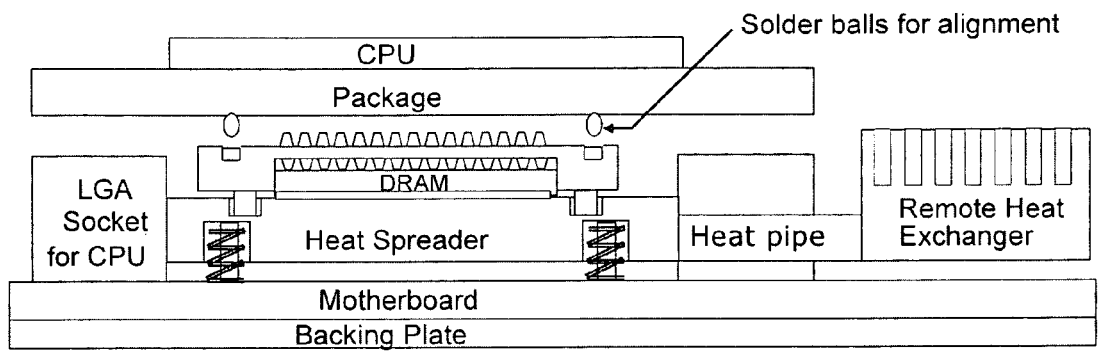
FIG. 8 is another block diagram in accordance with some embodiments of the invention.
Figure 9:
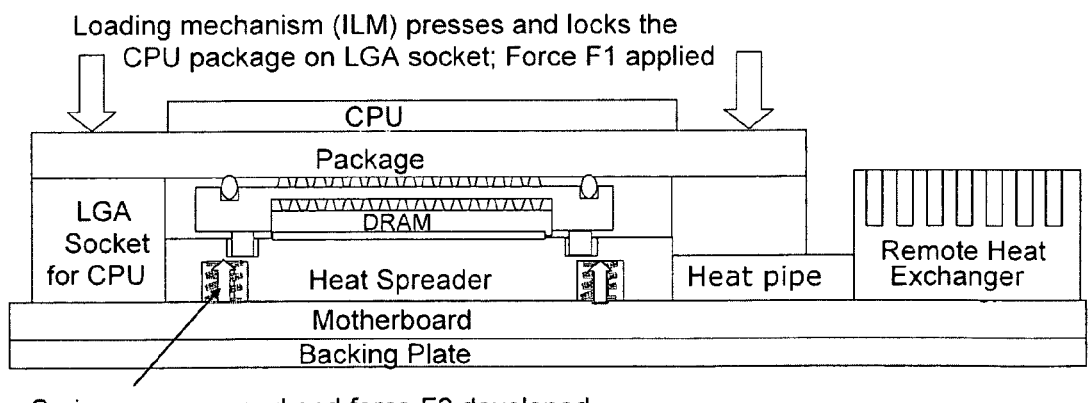
FIG. 9 is another block diagram in accordance with some embodiments of the invention.

In FIG. 8, the CPU Package may have solder balls on an underside of the CPU package for alignment purpose. The CPU package may be positioned on top of the DRAM socket, with the underside lands aligned with the DRAM socket's LGA contacts. FIG. 9 shows that when the Integrated Loading Mechanism (ILM) of the CPU socket is loaded, the CPU package gets pressed and locked on the main LGA socket. This action also compresses the underside assembly and develops compression in the springs in the heat spreader. Once the CPU package is inserted in the segmented socket and the clamps of the socket are locked in, the whole assembly gets compressed and electrical contact is established between the package underside lands and the DRAM. Advantageously, some embodiments of the invention may provide a relatively easy, removable assembly of DRAM devices on an underside of a CPU package.

Some embodiments of the invention may not be restricted to any particular LGA technology, and can make use of a variety of removable interconnect techniques, such as Metallized Particle Interconnects (MPI) or Stamped Metal pins. In some embodiments of the invention the DRAM socket may utilize a double compression LGA mechanism such as a Metallized Particle Interconnect (MPI). Alternatively, in some embodiments of the invention the DRAM socket may use a single compression interconnect. For example, the interconnect DRAM socket may be permanently attached (e.g. soldered) to the CPU package underside, and the DRAM can be attached to the single compression DRAM socket in a removable fashion. Advantageously, in some embodiments of the invention the DRAM devices may not require solder balls which may result in cost savings (e.g. as compared to BGA DRAM devices).

Figure 10:
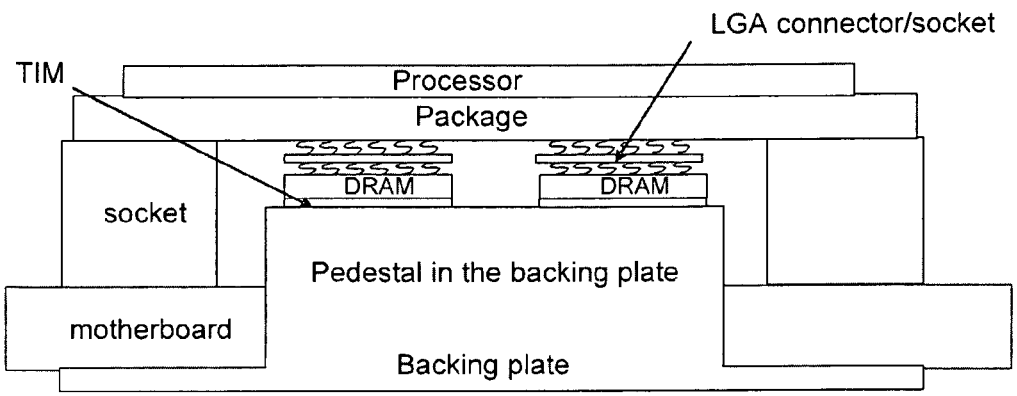
FIG. 10 is a block diagram of another electronic system in accordance with some embodiments of the invention.

With reference to FIG. 10, some embodiments of the invention may utilize a non-segmented socket. For example, if the thermal solution does not require a heat pipe, a standard (non-segmented) socket may be suitable. For example, the motherboard may have a cutout, and the backing plate may provide a pedestal through the cutout which is thermally coupled to the package-underside DRAM. The backing plate acts as a heat sink and can remove some of the heat. For DRAMs with low thermal dissipation, this type of non-heat pipe based thermal solution can be utilized.

Figure 11:
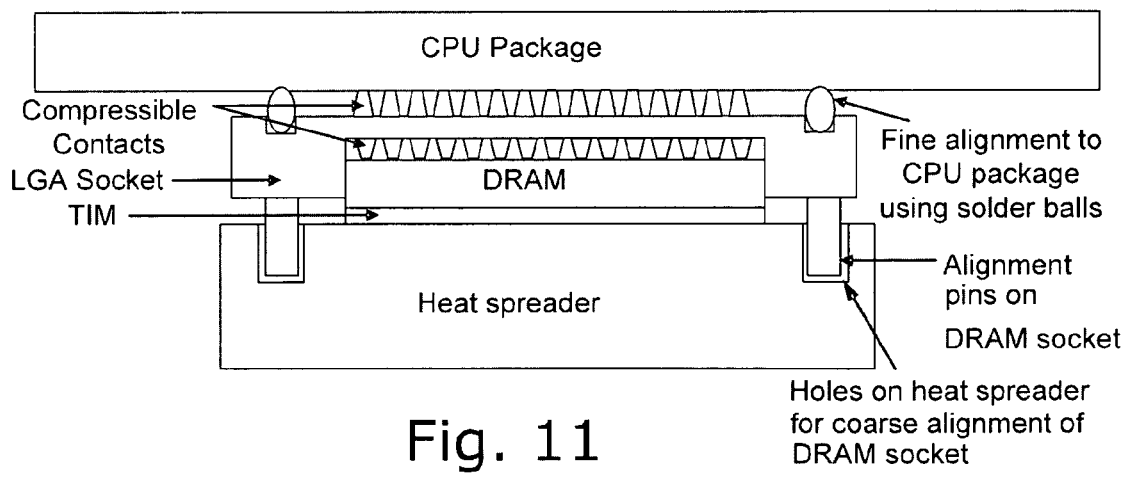
FIG. 11 is a block diagram of another electronic system in accordance with some embodiments of the invention.

With reference to FIG. 11, alignment features in accordance with some embodiments of the invention are shown in more detail. For example, the LGA socket for the DRAM may have alignment pins on the DRAM side which get inserted loosely in matching holes on the heat spreader. The alignment pins enable a coarse alignment of the DRAM socket on the heat spreader. The top-side (e.g. CPU side) of the DRAM socket may have two fine alignment holes which align with two solder balls (e.g. specifically added for alignment purpose) on the CPU package. These solder balls help ensure fine alignment of the DRAM socket with the CPU package underside. For example, these alignment features may be particularly useful for a double compression type LGA socket.

Advantageously, some embodiments of the invention may provide removable DRAM in a 3D package stack that enables easy replacement and simplifies upgrades. For example, if the memory die is soldered to the package there are several risks on both the technical and business aspects. For example, if a problem is discovered during testing of the CPU-DRAM assembly, there is no easy way of removing the DRAM if it is soldered to the package. Furthermore, should the memory die fail at some point of time after testing, it is not difficult to replace the memory die and instead, the whole package may need to be replaced. Advantageously, some embodiments of the invention may enable easy change-out of memory die for failure replacement or configuration upgrade.

The foregoing and other aspects of the invention are achieved individually and in combination. The invention should not be construed as requiring two or more of such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. A stacked package assembly, comprising:
a first socket defining an interior cavity;
a first semiconductor device coupled to the first socket;
a second socket positioned within the interior cavity of the first socket; and
a second semiconductor device removably coupled to the second socket within the cavity of the first socket,
wherein the second socket is positioned between the first semiconductor device and the second semiconductor device and provides an electrical connection between the first semiconductor device and the second semiconductor device.

2. The assembly of claim 1, wherein the second semiconductor device is solderlessly coupled to the second socket.

3. The assembly of claim 1, further comprising:
a single loading mechanism to provide a compression connection between all of the first socket, the first semiconductor device, the second socket, and the second semiconductor device.

4. The assembly of claim 3, wherein the second socket is soldered to the first semiconductor device and wherein the second socket includes a single compression interconnect mechanism.

5. The assembly of claim 3, wherein the second socket comprises a removable socket.

6. The assembly of claim 5, wherein the removable second socket comprises a double compression interconnect mechanism.

7. The assembly of claim 5, wherein the removable second socket comprises a coarse alignment feature on a side of the second socket proximate the second semiconductor device and a fine alignment feature on another side of the second socket proximate the first semiconductor device.

8. The assembly of claim 5, wherein the removable second socket comprises a land grid array socket.

9. The assembly of claim 5, wherein the removable second socket comprises a ball grid array socket.

10. The assembly of claim 5, wherein the removable second socket comprises a pin grid array socket.

11. A processor-based system, comprising:
a circuit board;
a first socket mounted on the circuit board, the first socket defining an interior cavity;
a processor device coupled to the first socket;
a second socket positioned within the cavity of the first socket;
a memory device removably coupled to the second socket within the cavity of the first socket, wherein the second socket is positioned between the processor device and the memory device and provides an electrical connection between the processor device and the memory device; and
a heat spreader thermally coupled to the memory device within the cavity of the first socket, wherein the heat spreader is positioned between the circuit board and the memory device.

12. The system of claim 11, wherein the memory device is solderlessly coupled to the second socket.

13. The system of claim 11, further comprising:
a single loading mechanism to provide a compression connection between all of the first socket, the processor device, the second socket, and the memory device.

14. The assembly of claim 13, wherein the second socket is soldered to the processor device and wherein the second socket includes a single compression interconnect mechanism.

15. The system of claim 13, further comprising:
a spring mechanism positioned between the circuit board and the heat spreader.

16. The system of claim 13, wherein the second socket comprises a removable socket.

17. The system of claim 16, wherein the removable second socket comprises a double compression interconnect mechanism.

18. The system of claim 16, wherein the removable second socket comprises a coarse alignment feature on a side of the second socket proximate the memory device and a fine alignment feature on another side of the second socket proximate the processor device.

19. The system of claim 16, wherein the removable second socket comprises a land grid array socket.

20. The system of claim 16, wherein the removable second socket comprises a ball grid array socket.

21. The system of claim 16, wherein the removable second socket comprises a pin grid array socket.

22. The system of claim 11, further comprising:
thermal interface material positioned between the memory device and the heat spreader.

23. The system of claim 22, further comprising:
a heat pipe thermally coupled to the heat spreader.

24. The system of claim 11, wherein the processor device comprises a central processor unit.

25. The system of claim 11, wherein the processor device comprises a graphics processor.

* * * * *